United States Patent [19]

Kinoshita et al.

[11] Patent Number: 5,282,946

[45] Date of Patent: Feb. 1, 1994

[54] PLATINUM-COBALT ALLOY SPUTTERING TARGET AND METHOD FOR MANUFACTURING SAME

[75] Inventors: Makoto Kinoshita; Jun Tamura; Masaki Morikawa, all of Sanda; Kunio Kishida, Tokyo; Toshinori Ishii; Akifumi Mishima, both of Sanda, all of Japan

[73] Assignee: Mitsubishi Materials Corporation, Tokyo, Japan

[21] Appl. No.: 903,748

[22] Filed: Jun. 25, 1992

[30] Foreign Application Priority Data

Aug. 30, 1991 [JP] Japan .................. 3-220566
Mar. 3, 1992 [JP] Japan .................. 4-45798

[51] Int. Cl.⁵ .................. C23C 14/34; C22C 19/07
[52] U.S. Cl. .................. 204/298.13; 204/192.2; 148/674; 148/678; 420/435; 420/436; 420/439; 420/466; 420/468
[58] Field of Search .................. 204/298.13, 192.2; 420/435–436, 439, 466, 468; 148/674, 678

[56] References Cited

U.S. PATENT DOCUMENTS

| | | | |
|---|---|---|---|
| 4,505,798 | 3/1985 | Ramachandran et al. | 204/298.09 |
| 4,749,459 | 6/1988 | Yamashita et al. | 204/192.15 |
| 4,832,810 | 5/1989 | Nakamura et al. | 204/192.15 |
| 5,004,652 | 4/1991 | Lal et al. | 428/611 |
| 5,112,468 | 5/1992 | Weigert et al. | 204/298.13 |
| 5,180,640 | 1/1993 | Yamashita et al. | 428/611 |

FOREIGN PATENT DOCUMENTS 0252478 1/1988 European Pat. Off.

OTHER PUBLICATIONS

Patent Abstracts of Japan, vol. 12, No. 405, Oct. 26, 1988, JP-A-63-143258, Masatoshi Fukushima, "Sputtering Target".

*Primary Examiner*—Aaron Weisstuch
*Attorney, Agent, or Firm*—Oblon, Spivak, McClelland, Maier & Neustadt

[57] ABSTRACT

A sputtering target of platinum-cobalt alloy is disclosed which contains 10 to 55% by weight of platinum; 1 to 15% by weight of a first additional element selected from the group consisting of nickel and tantalum; no more than 1.5% by weight of a second additional element selected from the group consisting of boron, titanium, lanthanum, cerium, neodymium, beryllium, calcium, zirconium, and silicon; no more than 20% by weight of chromium; and balance cobalt. A method for manufacturing the sputtering target is also disclosed. In the method, a platinum-cobalt alloy containing specific ingredients in predetermined amounts is first prepared. Then, the platinum-cobalt alloy is subjected to hot plastic working with a thickness reduction of no less than 30%. Subsequently, the alloy thus hot worked is subjected to a cold plastic working with a thickness reduction of no less than 5% at a temperature less than the recrystallization temperature of the alloy.

19 Claims, 3 Drawing Sheets

PLATINUM-COBALT ALLOY SPUTTERING TARGET AND METHOD FOR MANUFACTURING SAME

BACKGROUND OF THE INVENTION

1. Field of the Invention

The present invention relates to a sputtering target made of a platinum-cobalt alloy which is excellent in workability in hot working operation, and a method specifically adapted to manufacture the same.

2. Prior Art

Due to the rapid progress of information processors in recent years, a recording capability of higher density is required for magnetic disk units which constitute the main parts of a memory storage. A thin film of a chromium-platinum-cobalt (Cr-Pt-Co) alloy has been hitherto known as being suitable for effecting such high-density recording since it contains a large amount of platinum and exhibits high coercivity. A conventional Cr-Pt-Co alloy target which consists, for example, of 5 to 20% by weight of Cr, 10 to 55% by weight of Pt and balance Co may be suitably sputtered to form magnetic recording thin films.

However, the aforesaid conventional target has a high magnetic permeability $\mu$ of about 30 to 40. Therefore, when forming a thin film by the application of a magnetron sputtering process, the rate of formation of the thin film cannot be increased. In addition, since thin targets can only be employed, the target must frequently be exchanged for a new one, resulting in hindrances to industrial application. Furthermore, the surface of the target is locally subjected to erosion during the sputtering, so that the efficiency of use of the target is deteriorated.

Moreover, although the platinum contained in a large amount in the target alloy enhances coercivity, it makes the resulting target susceptible to cracking when subjected to plastic working, whether hot working or cold working. Therefore, it is very difficult to manufacture targets of a large area.

Furthermore, when the aforesaid target is produced by a known casting method, there occur casting defects which may often induce abnormal discharge during the sputtering operation or may cause foreign matter to adhere to the film formed.

SUMMARY OF THE INVENTION

It is therefore a primary object of the present invention to provide a sputtering target of a platinum-cobalt alloy in which plastic working operation can be effected during its manufacture, and which exhibits sufficiently low magnetic permeability.

Another object of the invention is to provide a manufacturing method which is specifically adapted to fabricate the aforesaid sputtering target.

According to a first aspect of the invention, there is provided a sputtering target of a platinum-cobalt alloy consisting essentially of 10 to 55% by weight of platinum; 1 to 15% by weight of at least one first additional element selected from the group consisting of nickel and tantalum; no more than 1.5% by weight of at least one second additional element selected from the group consisting of boron, titanium, lanthanum, cerium, neodymium, beryllium, calcium, zirconium, and silicon; no more than 20% by weight of chromium; and balance cobalt.

In the foregoing, if the contents of platinum and/or chromium fall outside the above ranges, thin films to be formed using the resulting target do not exhibit high coercivity. In addition, when nickel and/or tantalum are added in amounts as specified above, the cast product of the alloy has minuscule crystal grains, and hence workabilities during the hot plastic working operation of the cast product as well as during the cold plastic working operation after the hot plastic working are improved. Furthermore, the addition of the second additional element, such as boron, lanthanum, cerium, neodymium or the like, in amounts as specified above, further improves the workability during the plastic working operations. Additionally, when the used targets are melted, the above elements prevent the oxygen content in the alloy from increasing, and hence the targets can be recycled.

According to another aspect of the invention, there is provided a method for manufacturing a sputtering target comprising the steps of:

(a) preparing a platinum-cobalt alloy consisting of 10 to 55% by weight of platinum, 1 to 15% by weight of at least one first additional element selected from the group consisting of nickel and tantalum, no more than 1.5% by weight of at least one second additional element selected from the group consisting of boron, titanium, lanthanum, cerium, neodymium, beryllium, calcium, zirconium, and silicon, no more than 20% by weight of chromium, and balance cobalt;

(b) subsequently subjecting the platinum-cobalt alloy to a hot plastic working with a thickness reduction (T) of no less than 30%; and (c) subsequently subjecting the hot worked alloy to a cold plastic working with a thickness reduction of no less than 5% at a temperature less than the recrystallization temperature of the alloy.

In the foregoing, the reduction T is defined by the following formula:

$T = dT/T_o \times 100$ wherein dT and $T_o$ denote the amount of thickness reduction and the thickness prior to plastic working operations, respectively.

In addition, the hot plastic working is defined by a plastic working operation which is carried out at a temperature exceeding the recrystallization temperature of the alloy.

With the above hot plastic working operation with a thickness reduction of no less than 30%, the casting defects within the cast structure can be removed, and it becomes possible to carry out the subsequent cold plastic working. With the cold plastic working carried out with a thickness reduction of no less than 5%, the magnetic permeability can be sufficiently reduced.

DESCRIPTION OF THE INVENTION

Figure 1:
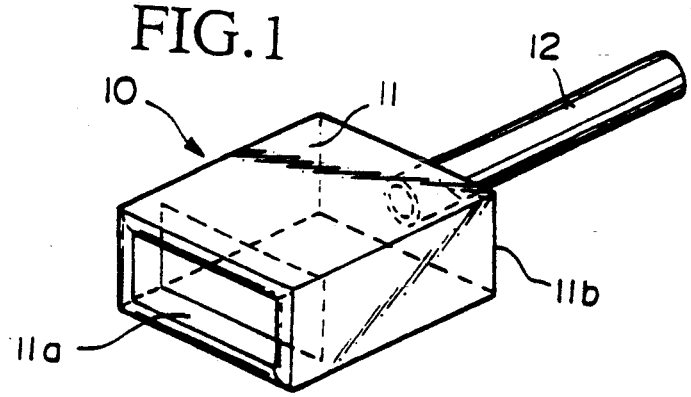
FIG. 1 is a perspective view of a stainless steel container for use in the manufacture of a sputtering target in accordance with the present invention.

The inventors have made an extensive study of the improvement of a target of a platinum-cobalt alloy, and have determined that the disadvantages as previously mentioned can be overcome by the addition of some specific ingredients. More specifically, the inventors have discovered a sputtering target of a platinum-cobalt alloy characterized in that it consists essentially of 10 to 55% by weight of platinum; 1 to 15% by weight of at least one first additional element selected from the group consisting of nickel and tantalum; no more than 1.5% by weight of at least one second additional element selected from the group consisting of boron, titanium, lanthanum, cerium, neodymium, beryllium, calcium, zirconium, and silicon; no more than 20% by weight of chromium; and balance cobalt.

In the foregoing, if the proportions of platinum and/or chromium fall outside the above ranges, thin films formed by using the resulting target do not exhibit high coercivity. In addition, when nickel and/or tantalum are added in amounts as specified above, the cast product of the alloy has minuscule crystal grains, and hence workabilies during the hot plastic working operation of the cast product as well as during the cold plastic working operation after the hot plastic working are improved. Furthermore, the addition of the second additional element, such as boron, lanthanum, cerium, neodymium or the like, in amounts as specified above, further improves the workability during the plastic working operations. Additionally, when the used targets are melted, the above elements prevent the oxygen content in the alloy from increasing, and hence the targets can be recycled.

Furthermore, it is preferable that the sulfur contained as impurities in the alloy of the sputtering target be reduced to no greater than 50 ppm by weight in order to further prevent cracking from occurring during the plastic working operations. In addition, if the carbon and oxygen contents are reduced to no greater than 100 ppm by weight and 200 ppm by weight, respectively, the coercivity of the thin film formed by the target can be further enhanced.

Moreover, it is preferable that the aforesaid platinum-cobalt alloy have an average grain size of no greater than 20 $\mu$m. If the average grain size exceeds 20 $\mu$m, the directions in which metal atoms are scattered are biased, so that the magnetic characteristics of the thin film formed by the target becomes unstable.

Moreover, in the sputtering target of the invention, it is preferable that the segregation of the chromium constituent among a plurality of measuring points is no greater than $\pm 0.25\%$ by weight, and the segregation of the platinum constituent measured among a plurality of measuring points is no greater than $\pm 0.20\%$ by weight. When the segregations of the chromium and platinum constituents fall within the above ranges, the variation in each of the constituents of the target is sufficiently small, and the problems regarding a disproportionate decrease of target material as well as inequality of the leakage flux density will be avoided. Furthermore, biasing of the directions in which the metal atoms are scattered during the sputtering becomes extremely rare. As a result, the variations in the constituents and thickness of the formed film are reduced, and the magnetic characteristics of the formed film can be made stable.

The method of manufacturing a sputtering target in accordance with the invention will now be described.

Figure 2:
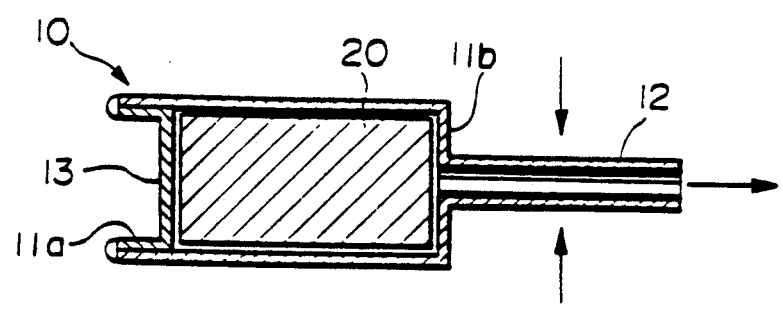
FIG. 2 is a longitudinal cross-sectional view of the container of FIG. 1.

FIGS. 1 and 2 depict a stainless steel container to be employed in the manufacture of the target. The container, generally designated by 10, comprises a tubular container body 11 of a generally rectangular cross-section having an open end 11a at its one end. A cylindrical member or portion 12 is mounted on an end face 11b at its other end so as to be communicated with the interior of the container body 11. In addition, as shown in FIG. 2, a lid member 13 is releasably fitted on the open end 11a of the container body 11 to close the opening.

First, an ingot of a platinum-cobalt alloy as described above, i.e., an alloy consisting of 10 to 55% by weight of platinum, 1 to 15% by weight of a first additional element selected from the group consisting of nickel and tantalum, no more than 1.5% by weight of a second additional element selected from the group consisting of boron, titanium, lanthanum, cerium, neodymium, beryllium, calcium, zirconium, and silicon, no more than 20% by weight of chromium, and balance cobalt, is prepared by a vacuum casting method. The resulting platinum-cobalt alloy ingot is cut into blank plates 20 of a prescribed rectangular parallelepiped shape. The blank plates 20 should be formed so as to be analogous to and slightly smaller than the shape of the inner periphery of the aforesaid stainless steel container 10. Therefore, the blank plate 20 is inserted into the stainless steel container 10 and the lid member 13 is fitted on the opening 11a of the container body 11 and welded thereto. A vacuum pump is then connected to the open end of the cylindrical member 12, and the steel container 10 is evacuated until the interior pressure reaches no greater than $5 \times 10^{-4}$ torr. Subsequently, the container is sealed by heating and pressing together several portions of the cylindrical member 12 disposed in axially spaced relation to one another.

The ingot thus sealed in the container 10 is subjected to annealing at a temperature of 400° C. to 700° C. for 30 minutes to 120 minutes, and thereafter a rolling operation is carried out before the ingot cools off, i.e., hot rolling operation is carried out, until a reduction T of 3% to 10% of the thickness of the ingot is achieved. These procedures are repeated until the thickness reduction T becomes 30%. In the foregoing, the reduction T is defined by the following formula:

$$T = dT/T_o \times 100$$

wherein $dT$ and $T_o$ denote the amount of thickness reduction and the thickness prior to rolling operations, respectively. Furthermore, the hot rolling operation is carried out at a temperature greater than the recrystallization temperature of the alloy. Thereafter, the alloy thus hot rolled is subjected to a cold rolling operation with a thickness reduction of no less than 5% at a temperature less than the recrystallization temperature of the alloy. With this cold rolling operation, the magnetic permeability can be sufficiently reduced.

After the cold rolling operation is completed, the stainless steel container 10 is removed by machining.

Thereafter, the rolled product is reformed by working such as pressing, and then the rolled product is shaped into a target member by subjecting it to finishing processing such as cutting, wire-cut electric discharge machining, mirror polishing, and the like. The target member thus formed is brazed to a cooled copper plate to provide a sputtering target.

According to the manufacturing method as described above, the blank plate can be rolled without causing any cracking or chipping. In particular, since the blank plate is sealed within the container, the surface of the blank plate is prevented from becoming fragile due to oxidation during the rolling operation, and the separation of the surface portion as well as the development of cracking can be prevented. Therefore, targets of high quality can be obtained.

Furthermore, with the above hot rolling operation with a thickness reduction of no less than 30%, the casting defects within the cast structure can be removed, so that it becomes possible to carry out the subsequent cold rolling operation. In addition, with the subsequent cold rolling operation, the magnetic permeability can be sufficiently reduced.

In the above method, a hot isostatic pressing may be additionally carried out after the containment operation is completed. With this operation, the blank plate 20 contained in the container 10 is brought into firm contact with the container 10, and hence the blank plate can be hot-rolled at a higher reduction without causing any cracking or chipping.

Figure 3:
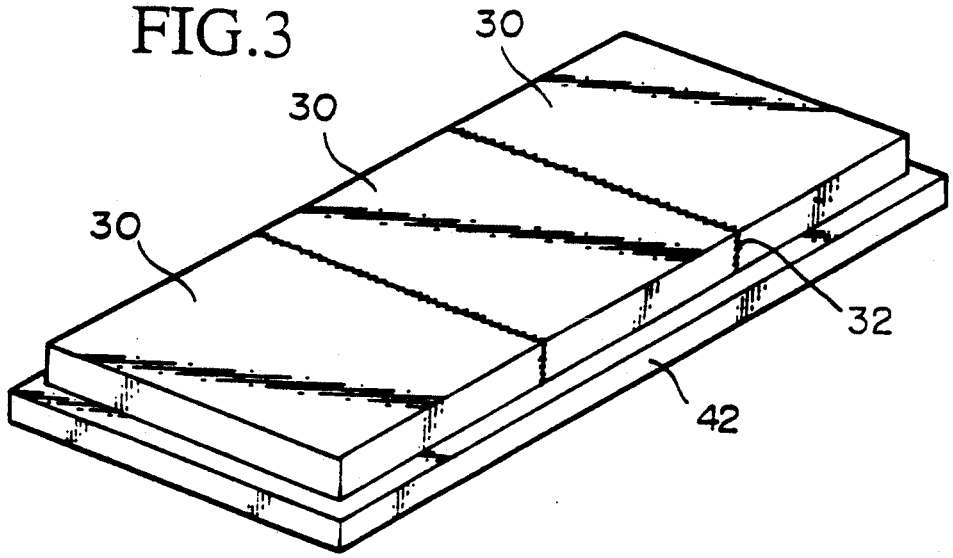
FIG. 3 is a perspective view of a sputtering target in which a plurality of target members are joined together.
Figure 4:
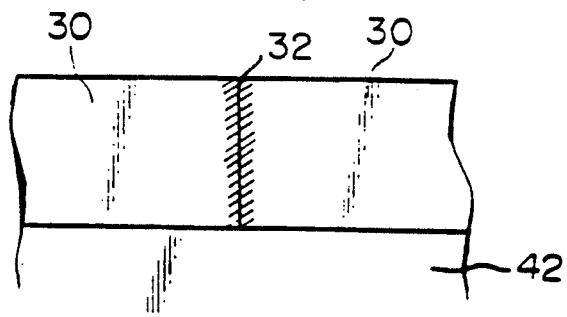
FIG. 4 is an enlarged side-elevational view of a part of the target of FIG. 3.
Figure 5:
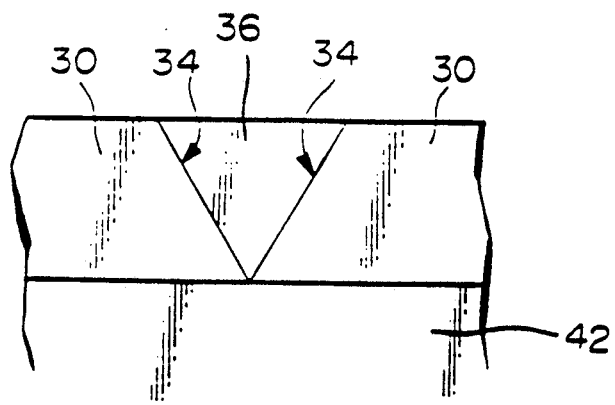
FIG. 5 is a view similar to FIG. 4, but showing a modified target.
Figure 6:
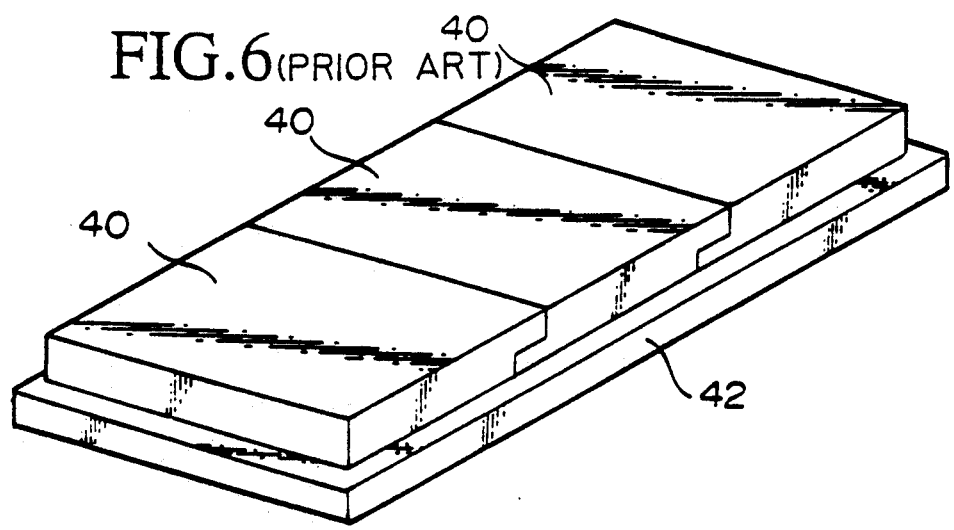
FIG. 6 is a view similar to FIG. 3, but showing a conventional arrangement of the target members.
Figure 7:
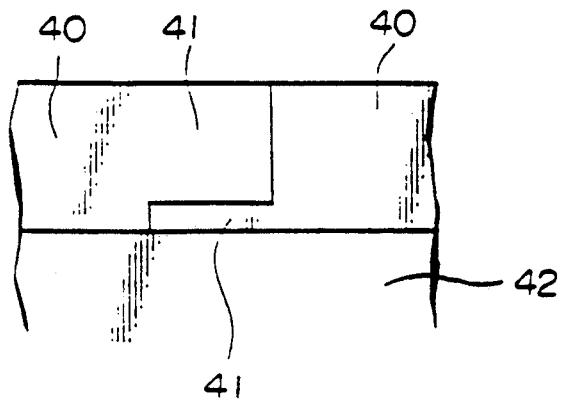
FIG. 7 is an enlarged side-elevational view of a part of the target of FIG. 6.

Furthermore, in the present invention, a sputtering target of a large area can be obtained by the application of the rolling operation. However, in order to obtain an even larger area, a plurality of sputtering target members of the invention may be combined together. In this connection, FIGS. 6 and 7 depict a conventional arrangement of a plurality of sputtering target members which are combined together. In this arrangement, each target member 40 is provided with a protruding portion 41 at its end face, and adjacent target members are disposed side by side and combined together with the protruding portion 41 of one target member being placed over the protruding portion 41 of the other. However, with this arrangement, when the protruding portion of the upper target member is consumed, the target member must be replaced by a new one. Otherwise, ions will penetrate through a slight gap between the remaining protruding portion of the lower target member and the upper target member into backing plate 42 to sputter the copper atoms thereof. In order to prevent this problem, the arrangement as shown in FIGS. 3 and 4 is adopted, in which the adjacent sputtering target members 30 are joined together by bringing their end faces 32 into contact with each other and joining them together by fusion. Furthermore, FIG. 5 depicts a further modification of this arrangement. In this embodiment, the end face of each sputtering target member 30 is cut obliquely, and two sputtering target members 30 are arranged so that their opposed end faces define a V-shaped groove 34 therebetween. Then, a fused alloy 36 of the same composition as the sputtering target members is received in the V-shaped groove and is fused together.

The present invention will now be illustrated in detail by way of the following examples:

EXAMPLE 1

Constituent powders weighed in predetermined amounts as shown in Table 1 were melted in vacuum or in an argon gas atmosphere and were cast into a heat-resistant mold to produce ingots of the compositions as shown in Table 1. Each ingot thus formed was cut into blank plates of prescribed rectangular parallelepiped shape by a wire-cut electric discharging machine. The blank plates were formed so as to be analogous to and slightly smaller than the shape of the inner periphery of the stainless steel container 10 as previously explained. Thereafter, the resulting blank plate 20 was inserted into the container 10, and a lid member 13 was fitted in the opening of the container and welded thereto. Thereafter, a vacuum pump was connected to the open end of the cylindrical portion 12, and the steel container was evacuated until the pressure reached about $1 \times 10^{-4}$ torr. Subsequently, the container was sealed by heating and pressing together three portions of the cylindrical portion 12 in axially spaced relation to one another.

The ingot thus sealed in the container 10 was subjected to annealing at a temperature of 600° C. for one hour, and then a hot rolling operation was carried out two times before the ingot cooled completely. As a result, the thickness of the ingot was reduced by 5% with respect to the thickness of the ingot prior to the rolling operation, i.e., 5% reduction was achieved.

When the aforesaid operation of annealing and rolling was completed one time, it was examined by X-rays to determine whether or not cracking occurred. The results are also set forth in Table 1, in which "o" indicates that cracking was not observed whereas "x" indicates that cracking was observed.

Thereafter, the ingots for which no cracking had been observed were further subjected to the same hot rolling operations several times until the reductions as set forth in Table 2 were achieved.

Subsequently, each ingot thus treated was subjected to a rolling at a temperature less than the recrystallization temperature of the alloy, i.e., 300° C. Namely, a cold rolling operation was carried out. The reductions as set forth in Table 2 were achieved by performing one such cold rolling operation. After the cold rolling operation was completed, the stainless steel container 10 was removed by machining, and color checking was carried out to detect the presence of cracking. The results are also shown in Table 2, in which "o" indicates that cracking was not observed, whereas "x" indicates that cracking was observed.

After performing processing such as pressing to reform the rolled products, the rolled products that had no cracking were shaped into target members by subjecting them to finishing such as cutting, wire-cutting electric discharge machining, mirror polishing, and the like. The target members thus formed were bonded by brazing to cooled copper plates to provide sputtering targets.

The sputtering targets thus formed were then tested as to the magnetic permeability, coercivity, and average crystal grain size, and the results are shown in Table 2. In the test, the magnetic permeability of samples cut out from the targets were measured, while the coercivity was measured by sputtering the targets onto an aluminum substrate to form thin films thereon. Furthermore, the average grain size was obtained by measuring the lengthwise and crosswise widths of individual crystal grains which were observed in a prescribed domain of the surface of the target by a scanning electron microscope, taking the average of the measured data to thereby obtain the grain size, and repeating these procedures for the grains in the domain.

Furthermore, for comparison purposes, an alloy ingot prepared in the same way but without plastic working was used as a sample 23 and was compared with the aforesaid sputtering target of the invention.

As will be seen from Tables 1 and 2, the sputtering targets which are manufactured by plastic working and which exhibit low magnetic permeability can be manufactured by using a platinum-cobalt alloy which consists of 10 to 55% by weight of platinum; 1 to 15% by weight of a first additional element selected from the group consisting of nickel and tantalum; no larger than 1.5% by weight of a second additional element selected from the group consisting of boron, titanium, lanthanum, cerium, neodymium, beryllium, calcium, zirconium, and silicon; no larger than 20% by weight of chromium; and balance cobalt. In addition, the sputtering targets falling into the specified ranges of the invention have small average grain sizes.

Furthermore, it is seen that in order to make cold rolling possible, it is necessary to carry out hot rolling operations with a thickness reduction of no less than 30%, and that if the cold rolling with a thickness reduction of no less than 5% is carried out after the hot rolling with the thickness reduction of no less than 30%, the target manufactured exhibits sufficiently low magnetic permeability.

EXAMPLE 2

An alloy ingot, which consisted of 30% by weight of platinum, 10% by weight of nickel, 3% by weight of chromium, 2000 ppm by weight of boron and balance cobalt, was prepared by means of a vacuum casting method, and the same procedures as in Example 1 were repeated to produce a sputtering target 24 of the invention, with the exception that a hot isostatic pressing was added after the containment operation of the blank plate 20 into the container 10. The HIP was carried out under the pressure of 1000 kg/cm$^2$ at a temperature of 1250° C. for 2 hours.

With this additional procedure, the reduction was increased as shown in Table 2 without causing any cracking or chipping to develop. Furthermore, as seen in Table 2, the resulting target exhibits superior results with respect to other properties.

EXAMPLE 3

Ingots of chromium-platinum-cobalt alloys having the compositions as set forth in Table 3 were prepared by means of a vacuum casting method. Then, the same procedures as in Example 1 were repeated to produce the sputtering targets of the invention. In the targets thus obtained, the segregations of the platinum, cobalt, and nickel constituents were measured. More specifically, six measuring points, each having a size of 10 mm×10 mm were selected in the longitudinal and transverse directions, and a line analysis was carried out with respect to chromium and platinum at each of these measuring points by an electron probe microanalysis. Furthermore, the results of the measurements were confirmed by an inductively coupled plasma method.

Figure 8:
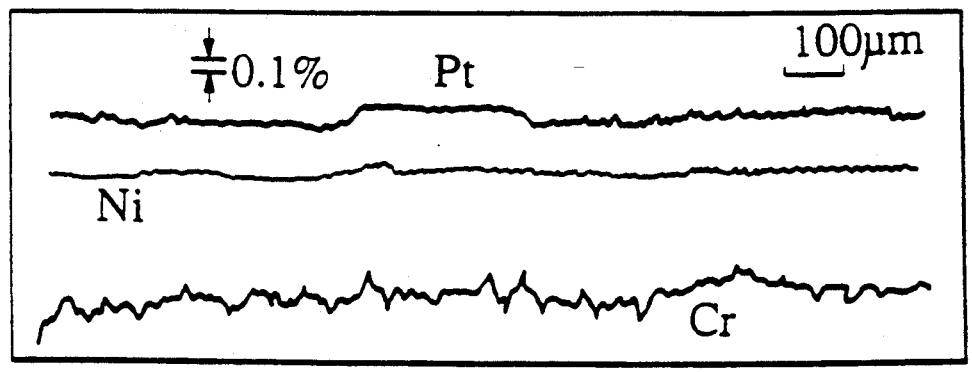
FIG. 8 is an electron probe microanalysis recording of Cr and Pt segregations for a sputtering target of the invention.
Figure 9:
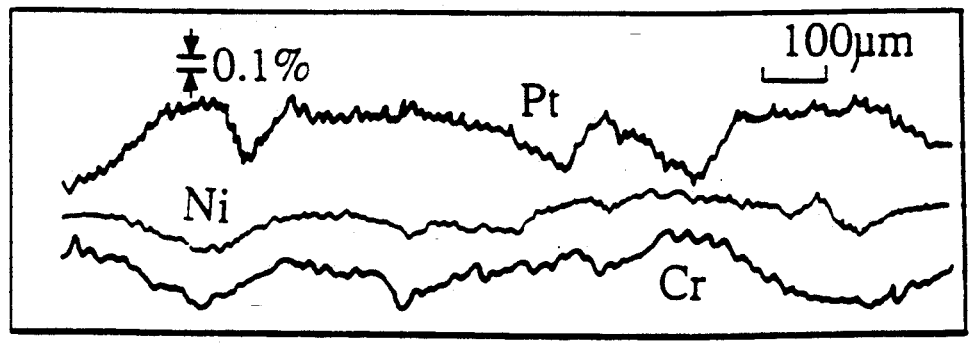
FIG. 9 is a recording similar to FIG. 8, but showing the results for a comparative example.

Furthermore, for comparison purposes, the starting alloy ingot was evaluated as a comparative example with respect to the same items. The results are all set forth in Table 3, in which the concentration of impurities denotes the concentration (% by weight) of metal and non-metal elements such as $O_2$, C or the like which are contained in the chromium-platinum-cobalt alloy. In addition, the results of the EPMA measurements are reproduced in FIGS. 8 and 9.

As will be seen from Table 3, the variations of the constituents in the surface of the targets of the invention are extremely small as compared with the comparative example. In addition, the magnetic permeability of the targets of the invention are maintained uniform, so that the stability of the magnetic film is ensured.

Moreover, the segregations of Pt and Cr of the comparative example are ±0.3% and ±0.35%, respectively, and are large, so that the alloy structure is not uniform. On the other hand, in the target of the invention, the segregations of Pt and Cr are ±0.08% and ±0.10%, respectively, and are very small, so that the alloy structure is uniform.

TABLE 1

| Sample Number | Composition Main constituents (wt %) | 1st additive (wt %) | 2nd additive (wt ppm) | Result of hot rolling |
|---|---|---|---|---|
| 1 | Co—1 Cr—10 Pt | 1 Ni | 10 La | o |
| 2 | Co—2 Cr—32 Pt | 5.5 Ni | 2000 B | o |
| 3 | Co—5 Cr—10 Pt | — | — | x |
| 4 | Co—20 Cr—55 Pt | — | — | x |
| 5 | Co—20 Cr—55 Pt | 20 Ni | — | x |
| 6 | Co—20 Cr—55 Pt | — | 20000 La | x |
| 7a | Co—20 Cr—55 Pt | 1 Ni | 5 La | x |
| 7b | Co—20 Cr—55 Pt | 1 Ni | 10 La | o |
| 7c | Co—20 Cr—55 Pt | 1 Ni | 15000 La | o |
| 7d | Co—20 Cr—55 Pt | 1 Ni | 20000 La | x |
| 8a | Co—20 Cr—55 Pt | 15 Ni | 5 La | x |
| 8b | Co—20 Cr—55 Pt | 15 Ni | 10 La | o |
| 8c | Co—20 Cr—55 Pt | 15 Ni | 15000 La | o |
| 8d | Co—20 Cr—55 Pt | 15 Ni | 20000 La | x |
| 9a | Co—20 Cr—55 Pt | 20 Ni | 10 La | x |
| 9b | Co—20 Cr—55 Pt | 20 Ni | 15000 La | x |
| 10 | Co—20 Cr—55 Pt | 1 Ni | 10 Ce | o |
| 11 | Co—20 Cr—55 Pt | 1 Ni | 10 Nd | o |
| 12 | Co—20 Cr—55 Pt | 1 Ni | 10 B | o |
| 13 | Co—20 Cr—55 Pt | 1 Ni | 10 Be | o |
| 14 | Co—20 Cr—55 Pt | 1 Ni | 10 Ca | o |
| 15 | Co—20 Cr—55 Pt | 1 Ni | 10 Zr | o |
| 16 | Co—20 Cr—55 Pt | 1 Ni | 10 Ti | o |
| 17 | Co—20 Cr—55 Pt | 1 Ni | 10 Si | o |
| 18 | Co—20 Cr—55 Pt | 1 Ta | 10 La | o |
| 19 | Co—20 Cr—55 Pt | 0.5 Ni—0.5 Ta | 5 La—5 Ce | o |
| 20 | Co—20 Cr—55 Pt | 0.5 Ni—0.5 Ta | 5 Be—5 Ca | o |
| 21 | Co—5 Cr—10 Pt | 15 Ni | 15000 La | o |
| 22a | Co—55 Pt | 1 Ni—1 Ta | 2000 B—1500 Ti | o |
| 22b | Co—10 Pt | 15 Ni | 2000 La—1500 Ca | o |
| 22c | Co—30 Pt | 15 Ta | 2000 Ce—1500 Si | o |
| 22d | Co—40 Pt | 7 Ni—8 Ta | 2000 Nd—1500 Zr | o |
| 23 | Co—1 Cr—10 Pt | — | — | — |
| 24 | Co—3 Cr—30 Pt | 10 Ni | 2000 B | o |
| 25 | Co—3 Cr—30 Pt | 1 Ni—1 Ta | — | o |
| 26 | Co—3 Cr—30 Pt | 5 Ni—5 Ta | — | o |
| 27 | Co—3 Cr—30 Pt | 7 Ni—8 Ta | — | o |
| 28 | Co—3 Cr—30 Pt | 15 Ta | — | o |

Sample 23 shows the compositon of the cast alloy

TABLE 2

| Sample Number | Reduction hot roll (%) | Reduction cold roll (%) | Result of cold rolling | Magnetic Permeability | Coercivity (Oe) | Average grain size (μm) |
|---|---|---|---|---|---|---|
| 1 | 30 | 5 | o | 15 | 2000 | 14.2 |
| 2 | 35 | 10 | o | 10 | 2100 | 8.5 |
| 7b | 25 | 5 | x | — | — | — |

TABLE 2-continued

| Sample Number | Reduction hot roll (%) | cold roll (%) | Result of cold rolling | Magnetic Permeability | Coercivity (Oe) | Average grain size (μm) |
|---|---|---|---|---|---|---|
|  | 30 | 2 | ○ | 30 | 2000 | 17.3 |
|  | 30 | 5 | ○ | 16 | 2000 | 13.2 |
|  | 40 | 2 | ○ | 25 | 2000 | 16.8 |
|  | 40 | 5 | ○ | 13 | 2000 | 13.6 |
| 7c | 25 | 5 | x | — | — |  |
|  | 30 | 2 | ○ | 30 | 2100 | 16.9 |
|  | 30 | 5 | ○ | 14 | 2100 | 14.1 |
|  | 40 | 2 | ○ | 25 | 2100 | 17.1 |
|  | 40 | 5 | ○ | 12 | 2100 | 13.2 |
| 8b | 25 | 5 | x | — | — |  |
|  | 30 | 2 | ○ | 30 | 2000 | 18.2 |
|  | 30 | 5 | ○ | 15 | 2000 | 14.0 |
|  | 40 | 2 | ○ | 25 | 2000 | 17.9 |
|  | 40 | 5 | ○ | 12 | 2000 | 14.2 |
| 8c | 25 | 5 | x | — | — |  |
|  | 30 | 2 | ○ | 30 | 2100 | 17.5 |
|  | 30 | 5 | ○ | 14 | 2100 | 13.8 |
|  | 40 | 2 | ○ | 25 | 2100 | 17.3 |
|  | 40 | 5 | ○ | 13 | 2100 | 13.4 |
| 10 | 35 | 7 | ○ | 13 | 2000 | 10.2 |
| 11 | 35 | 7 | ○ | 12 | 2000 | 10.6 |
| 12 | 35 | 7 | ○ | 12 | 2000 | 10.8 |
| 13 | 35 | 7 | ○ | 13 | 2000 | 9.7 |
| 14 | 35 | 7 | ○ | 12 | 2000 | 10.0 |
| 15 | 35 | 7 | ○ | 13 | 2000 | 9.8 |
| 16 | 35 | 7 | ○ | 13 | 2000 | 10.1 |
| 17 | 35 | 7 | ○ | 12 | 2000 | 10.2 |
| 18 | 35 | 7 | ○ | 13 | 2000 | 9.9 |
| 19 | 35 | 7 | ○ | 12 | 2000 | 9.8 |
| 20 | 35 | 7 | ○ | 12 | 2000 | 10.2 |
| 22a | 30 | 7 | ○ | 11 | 2000 | 13.5 |
| 22b | 30 | 7 | ○ | 12 | 2000 | 10.7 |
| 22c | 30 | 7 | ○ | 11 | 2000 | 14.2 |
| 22d | 30 | 7 | ○ | 11 | 2000 | 13.1 |
| 23 | — | — | — | 45 | 1950 | 3.6(mm) |
| 24 | 40 | 7 | ○ | 11 | 2000 | 9.8 |
| 25 | 35 | 7 | ○ | 10 | 2100 | 15.0 |
| 26 | 35 | 7 | ○ | 12 | 2100 | 13.7 |
| 27 | 35 | 7 | ○ | 11 | 2100 | 14.2 |
| 28 | 35 | 7 | ○ | 12 | 2100 | 14.5 |

TABLE 3

|  | Targents of the invention | | | | | Comparative example |
|---|---|---|---|---|---|---|
|  | 1 | 2 | 3 | 4 | 5 |  |
| Composition (wt %) | | | | | | |
| Co | bal. | bal. | bal. | bal. | bal. | bal. |
| Cr | 9.8 | 19.6 | 18.6 | 5.7 | 6.2 | 9.8 |
| Pt | 30.8 | 54.1 | 10.5 | 53.7 | 10.9 | 30.6 |
| Ni | 1.5 | 3.0 | 5.6 | 10.2 | 14.5 | 14.5 |
| Ta | — | 1.5 | 3.0 | — | — | — |
| B (wtppm) | 100 | 500 | 2000 | 5000 | 14000 | 14000 |
| Impurities (ppm) | | | | | | |
| O | 47 | 54 | 56 | 43 | 45 | 48 |
| C | 18 | 23 | 21 | 17 | 18 | 19 |
| Segregation of composition (wt %) | | | | | | |
| Cr | 0.10 | 0.20 | 0.18 | 0.07 | 0.8 | 0.35 |
| Pt | 0.08 | 0.17 | 0.07 | 0.18 | 0.09 | 0.30 |
| Variation of coercivity (%) | 6.1 | 9.5 | 8.2 | 7.1 | 5.7 | 15.0 |

What is claimed is:

1. A sputtering target of platinum-cobalt alloy consisting essentially of 10 to 55% by weight of platinum; 1 to 15% by weight of a first additional element selected from the group consisting of nickel and tantalum; no more than 1.5% by weight of a second additional element selected from the group consisting of boron, titanium, lanthanum, cerium, neodymium, beryllium, calcium, zirconium, and silicon; no more than 20% by weight of chromium; and the balance cobalt, wherein said alloy has an average grain size of no greater than 20 μm.

2. A sputtering target as recited in claim 1, having a magnetic permeability of no larger than 30.

3. A sputtering target as recited in claim 1, wherein the chromium constituent has a segregation of no greater than ±0.25% by weight, and the platinum constituent has a segregation of no greater than ±0.20% by weight.

4. A sputtering target as recited in claim 1, wherein said target comprises a plurality of sputtering target members, adjacent pairs of said sputtering target members being combined together with their respective end faces being mated and joined together by fusion.

5. A sputtering target as recited in claim 4, wherein said adjacent pairs of sputtering target members are configured so as to define a V-shaped groove therebetween, said sputtering target further comprising an additional fused target member of the same composition as said sputtering target members received in said V-shaped groove.

6. A target as claimed in claim 1, wherein said first additional element is tantalum.

7. A method of manufacturing a sputtering target, comprising the steps of:
   (a) preparing a platinum-cobalt alloy consisting of 10 to 55% by weight of platinum, 1 to 15% by weight of a first additive selected from the group consisting of nickel and tantalum, no more than 1.5% by weight of a second additive selected from the group consisting of boron, titanium, lanthanum, cerium, neodymium, beryllium, calcium, zirconium, and silicon, no more than 20% by weight of chromium, and balance cobalt;
   (b) subsequently subjecting the platinum-cobalt alloy to a hot plastic working with a thickness reduction of no less than 30%; and
   (c) subsequently subjecting the hot worked alloy to a cold plastic working with a thickness reduction of no less than 5% at a temperature less than the recrystallization temperature of the alloy.

8. A method of manufacturing a sputtering target as recited in claim 7, wherein said alloy preparation step (a) is carried out by a vacuum casting method.

9. A method of manufacturing a sputtering target as recited in claim 8, further comprising a containment step of inserting said alloy prepared in said alloy preparation step (a) into a container and evacuating said container, prior to said hot plastic working step (b).

10. A method of manufacturing a sputtering target as recited in claim 9, further comprising a step of annealing said container and cooling the same between said inserting step and said hot plastic working step (b).

11. A method of manufacturing a sputtering target as recited in claim 10, wherein said plastic workings in said steps (b) and (c) comprise rolling working.

12. A method of manufacturing a sputtering target as recited in claim 11, further comprising removing said container from the alloy after the completion of said cold rolling step and finish-working said plastic-worked product into a target material, and bonding said target material to a backing plate to produce the sputtering target.

13. A method as claimed in claim 11, wherein said rolling working in step (b) is carried out a temperature greater than the recrystallization temperature of the alloy, and wherein said rolling working in step (c) is carried out at a temperature less than the recrystallization temperature of the alloy.

14. A sputtering target produced by the method of claim 7.

15. A method of manufacturing a sputtering target as recited in claim 10, further comprising a step of hot isostatic pressing between said containment step and said annealing step.

16. A method as claimed in claim 10 wherein said alloy is annealed at 400° C. to 700° C. for from 30 to 120 minutes.

17. A sputtering target produced by the method of claim 13.

18. A method as claimed in claim 7, wherein said reduction in step (b) is from 30 to 40% and said reduction in step (c) is from 5 to 7%.

19. A method as claimed in claim 7, wherein said first additional element is tantalum.

* * * * *